US010918970B2

(12) United States Patent
Kimbel

(10) Patent No.: US 10,918,970 B2
(45) Date of Patent: Feb. 16, 2021

(54) SYSTEMS AND METHODS FOR EXTRACTING LIQUID

(71) Applicant: Corner Star Limited, Kowloon (HK)

(72) Inventor: Steven Lawrence Kimbel, St. Charles, MO (US)

(73) Assignee: Corner Star Limited, Kowloon (HK)

( * ) Notice: Subject to any disclaimer, the term of this patent is extended or adjusted under 35 U.S.C. 154(b) by 0 days.

(21) Appl. No.: 16/067,424

(22) PCT Filed: Dec. 22, 2016

(86) PCT No.: PCT/US2016/068408
§ 371 (c)(1),
(2) Date: Jun. 29, 2018

(87) PCT Pub. No.: WO2017/117021
PCT Pub. Date: Jul. 6, 2017

(65) Prior Publication Data

US 2019/0022552 A1 Jan. 24, 2019

Related U.S. Application Data

(60) Provisional application No. 62/272,959, filed on Dec. 30, 2015.

(51) Int. Cl.
*C30B 15/00* (2006.01)
*B01D 9/00* (2006.01)
(Continued)

(52) U.S. Cl.
CPC ......... *B01D 9/0009* (2013.01); *B01D 9/0013* (2013.01); *C30B 11/002* (2013.01); (Continued)

(58) Field of Classification Search
None
See application file for complete search history.

(56) References Cited

U.S. PATENT DOCUMENTS 3,012,265 A 12/1961 Courtenay
3,012,865 A 12/1965 Pellin
(Continued)

FOREIGN PATENT DOCUMENTS

CN 101920960 A 12/2010
CN 102159754 A 8/2011
(Continued)

OTHER PUBLICATIONS

International Search Report and Written Opinion of the International Searching Authority regarding PCT/US2016/068408 dated Apr. 18, 2017; pp. 1-12.

*Primary Examiner* — Tam M Nguyen
(74) *Attorney, Agent, or Firm* — Armstrong Teasdale LLP

(57) ABSTRACT

A system for extracting liquid is provided. The system includes a vacuum source and a nozzle having a wettable plunger and a vacuum tube connected in flow communication with the vacuum source. When the plunger is partly submerged in the liquid and the vacuum source is actuated to initiate a flow of gas through the vacuum tube, droplets of the liquid separate from at least a portion of the unsubmerged part of the plunger and become suspended in the gas flow. The system also includes a cooling structure positioned adjacent to the vacuum tube to facilitate solidifying the droplets suspended in the gas flowing through the vacuum tube.

6 Claims, 5 Drawing Sheets

(51) Int. Cl.

| | |
|---|---|
| ***C30B 15/02*** | (2006.01) |
| ***C30B 29/06*** | (2006.01) |
| ***C30B 11/00*** | (2006.01) |
| *C01B 33/039* | (2006.01) |

(52) U.S. Cl.
CPC .............. *C30B 15/00* (2013.01); *C30B 15/02* (2013.01); *C30B 29/06* (2013.01); *C01B 33/039* (2013.01)

(56) References Cited

U.S. PATENT DOCUMENTS

| | | | | |
|---|---|---|---|---|
| 3,523,330 | A | 8/1970 | Gallay | |
| 2018/0118585 | A1* | 5/2018 | Chidambaran | B01D 63/08 |
| 2019/0152832 | A1* | 5/2019 | Xu | C03C 21/007 |
| 2019/0161384 | A1* | 5/2019 | McEnroe | C03B 23/11 |

FOREIGN PATENT DOCUMENTS

| | | | |
|---|---|---|---|
| CN | 102976332 | A | 3/2013 |
| CN | 102976334 | A | 3/2013 |
| EP | 0679849 | A2 | 11/1995 |

* cited by examiner

SYSTEMS AND METHODS FOR EXTRACTING LIQUID

CROSS-REFERENCE TO RELATED APPLICATION

This application is a National Stage application of International Application No. PCT/US2016/068408, filed on Dec. 22, 2016, which claims priority to U.S. Provisional Patent Application No. 62/272,959, filed on 30 Dec. 2015, the entire disclosure of which is hereby incorporated by reference in their entirety.

FIELD

The field of the disclosure relates generally to systems and methods for extracting liquid and, more particularly, to systems and methods for vacuum extracting a molten liquid.

BACKGROUND

Monocrystalline silicon ("monosilicon") is typically produced using a Czochralski method (Cz) or a Continuous Czochralski method (CCz). Both methods include melting granules of polycrystalline silicon ("polysilicon") in a crucible and dipping a monosilicon seed crystal into the molten silicon. When the seed crystal begins to melt, the seed crystal is slowly withdrawn from the molten silicon at a predetermined rate, which causes the seed crystal to grow into an ingot of monosilicon. Once the ingot reaches a desired size, the ingot is removed, and another seed crystal is dipped into the molten silicon and slowly withdrawn to grow another ingot.

As this process is repeated to grow multiple ingots, the level of contaminants within the crucible gradually increases. Upon reaching a threshold level, the increase in contaminants can result in a production stoppage during which contaminated silicon is removed and replaced with fresh silicon. However, such stoppages can undesirably increase production costs, and it would be useful to provide for the removal of contaminated silicon while an ingot is being grown.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF SUMMARY

In one aspect, a system for extracting liquid comprises a vacuum source and a nozzle having a wettable plunger and a vacuum tube connected in flow communication with the vacuum source. When the plunger is partly submerged in the liquid and the vacuum source is actuated to initiate a flow of gas through the vacuum tube, droplets of the liquid separate from at least a portion of the unsubmerged part of the plunger and become suspended in the gas flow. The system also includes a cooling structure positioned adjacent to the vacuum tube to facilitate solidifying the droplets suspended in the gas flowing through the vacuum tube.

In another aspect, a method for extracting liquid comprises submerging part of a wettable plunger in a liquid such that a layer of the liquid develops on an unsubmerged part of the plunger. The method also includes applying vacuum pressure to a gaseous environment surrounding the layer of liquid such that droplets of the liquid separate from at least a portion of the unsubmerged part of the plunger and become suspended in a gas flowing over the layer. The method further includes cooling the droplets such that the droplets solidify while suspended in the gas flow.

In yet another aspect, a monosilicon production assembly comprises an ingot growth subassembly having a furnace, a crucible disposed in the furnace, a water-cooled jacket situated at least in part above the crucible, and a puller mechanism having a seed crystal insertable into the crucible. They assembly also includes an extraction subassembly having a holding reservoir, a vacuum source, a carrier gas source, and a nozzle having a wettable plunger and a pair of concentric tubes including an inner tube and an outer tube. The inner tube is connected in flow communication with the vacuum source across the holding reservoir, and the outer tube is connected in flow communication with the carrier gas source. The nozzle is insertable into the furnace via the jacket such that, when the carrier gas source and the vacuum source are actuated with the plunger partly submerged in molten silicon contained in the crucible, droplets of the molten silicon separate from at least a portion of the unsubmerged part of the plunger, become suspended in a flow of carrier gas through the inner tube, and solidify before reaching the holding reservoir for collection in the holding reservoir as solid particles.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

Corresponding reference characters indicate corresponding parts throughout the several views of the drawings.

DETAILED DESCRIPTION

Figure 1:
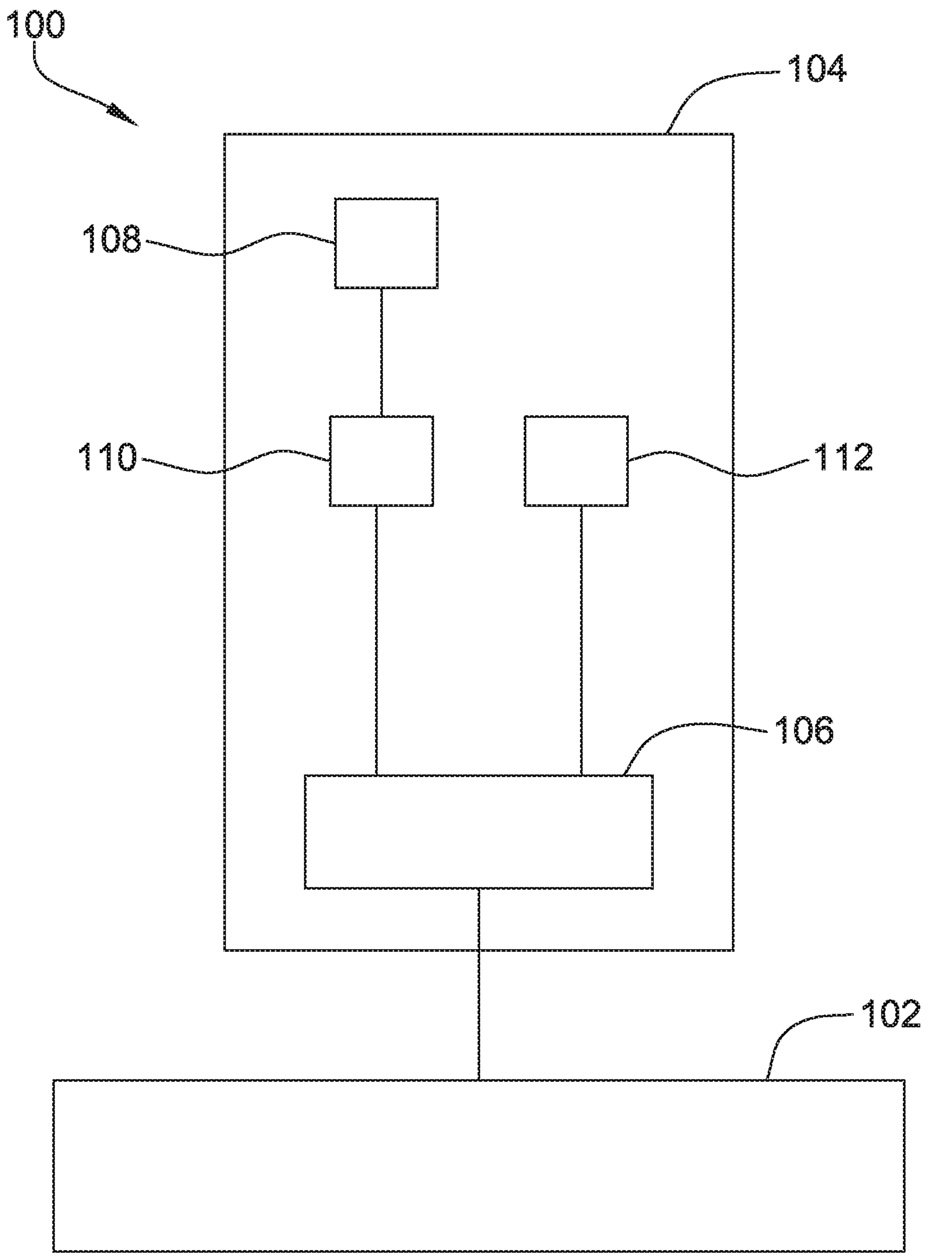
FIG. 1 is a schematic of a monosilicon production assembly.

Referring to FIG. 1, a monosilicon production assembly is shown schematically and is indicated generally at 100. The assembly 100 includes a growth subassembly 102 that facilitates growing monosilicon ingots from molten silicon, and an extraction subassembly 104 that facilitates extracting contaminated, molten silicon from the growth subassembly 102 to facilitate the efficient production of higher quality ingots of monosilicon. As set forth in more detail below, the extraction subassembly 104 includes a nozzle 106 connected in flow communication with, on the one hand, a vacuum source 108 across a holding reservoir 110 and, on the other hand, a carrier gas source 112 (e.g., a source of inert gas, such as argon and/or helium).

Figure 2:
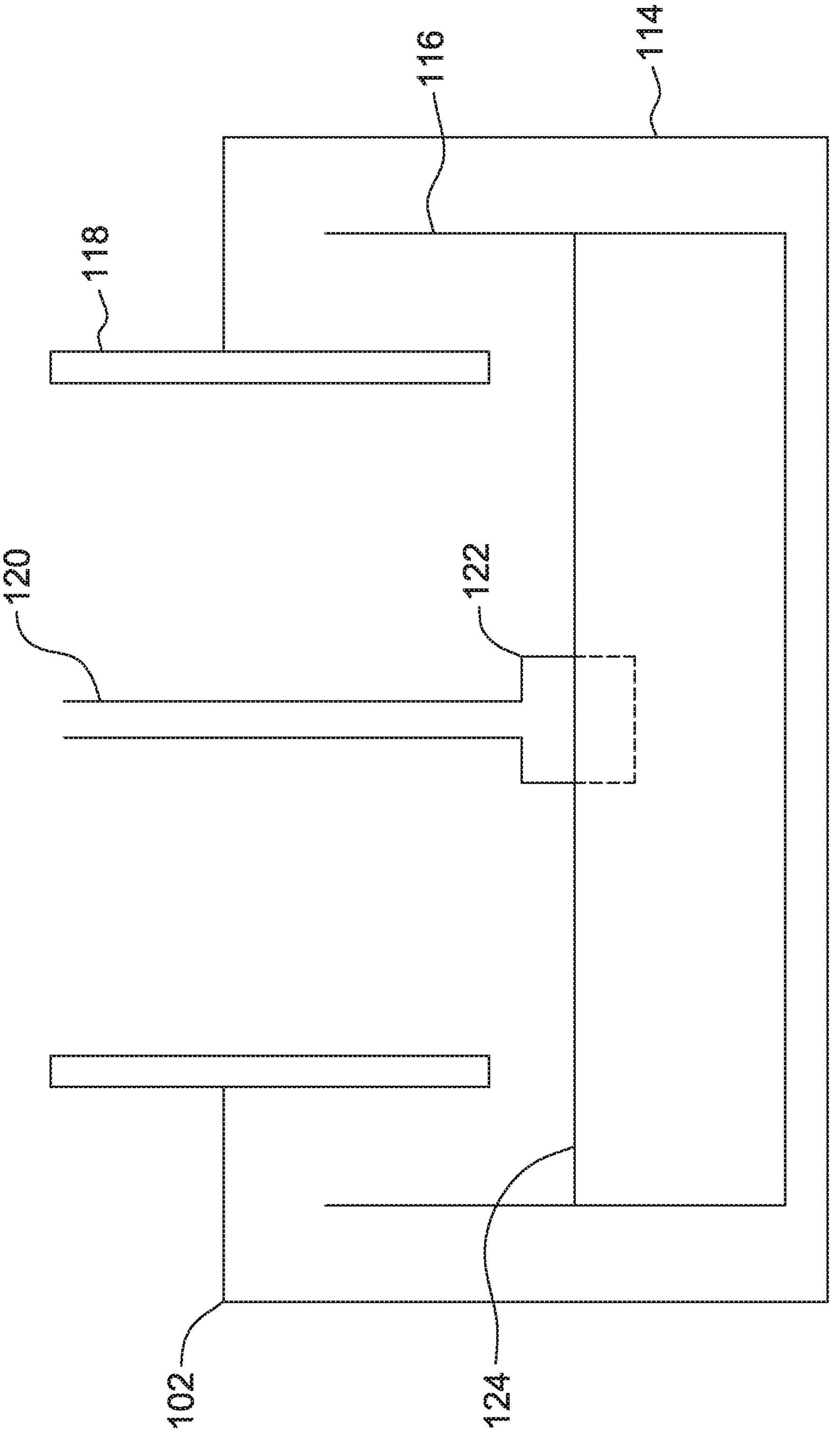
FIG. 2 is a schematic of a monosilicon ingot growth subassembly of the assembly shown in FIG. 1.

FIG. 2 is a schematic of the growth subassembly 102. In the illustrated embodiment, the growth subassembly 102 is configured to produce ingots of monosilicon via the Czochralski (Cz) or Continuous Czochralski (CCz) method. More specifically, the growth subassembly 102 includes a furnace 114, a crucible 116 disposed within the furnace 114, a cooling structure 118 situated at least in part above the crucible 116, and a puller mechanism 120 (e.g., a chuck) that is extendable into, and retractable out of, the cooling structure 118 and the crucible 116.

To operate the growth subassembly 102, granules (or another suitable form) of polysilicon are melted within the crucible 116 by elevating the temperature in the furnace 114, thereby forming molten silicon 124. A monosilicon seed crystal 122 is loaded onto the puller mechanism 120 by which the seed crystal 122 is dipped into the molten silicon 124 through the cooling structure 118. The seed crystal 122 is then rotated while being slowly withdrawn from the molten silicon 124 at a controlled rate, which causes the seed crystal 122 to grow into an ingot of monosilicon. While being withdrawn from the furnace 114 via the puller mechanism 120, the ingot is cooled via the cooling structure 118. Notably, after each ingot has been detached from the puller mechanism 120, the growth process can be repeated by loading a new seed crystal 122 onto the puller mechanism 120, dipping the new seed crystal 122 into the molten silicon 124, and slowly withdrawing the new seed crystal 122 to grow a new ingot therefrom.

In the illustrated embodiment, the cooling structure 118 is a generally tubular jacket that is liquid-cooled (e.g., water-cooled). For example, the wall(s) of the cooling structure 118 may have a plurality of cooling channels formed therein such that, when a pressurized liquid flows through the cooling channels, heat is removed from the walls and from nearby matter (e.g., heat is removed from an ingot being withdrawn from the molten silicon 124 via the puller mechanism 120). In some embodiments, however, the cooling structure 118 may have any suitable configuration and may be cooled in any suitable manner. Other contemplated methods of ingot cooling include conduction through a solid to a water-cooled weldment, or cold gas impingement.

While each batch of molten silicon 124 can be used to grow more than one ingot of monosilicon, the level of contaminants (e.g., carbon and/or metal) in the batch tends to increase with each ingot that is grown from the batch. Moreover, because the resulting ingot quality and the level of contaminants in the batch tend to be inversely proportional (i.e., as the level of contaminants increases, the ingot quality tends to decrease), it is desirable to periodically extract contaminants from the molten silicon 124 to facilitate maintaining a higher level of ingot quality and minimizing costs associated with operating growth subassembly 102. It is also desirable to not interrupt the continuity of the ingot-growing process for the purpose of extracting contaminants, because process interruptions generally lead to increased manufacturing costs. It would be useful to enable the removal of contaminants from the molten silicon 124 inside the crucible 116 without stopping or with minimal time interruption of the ingot-growing process.

Figure 3:
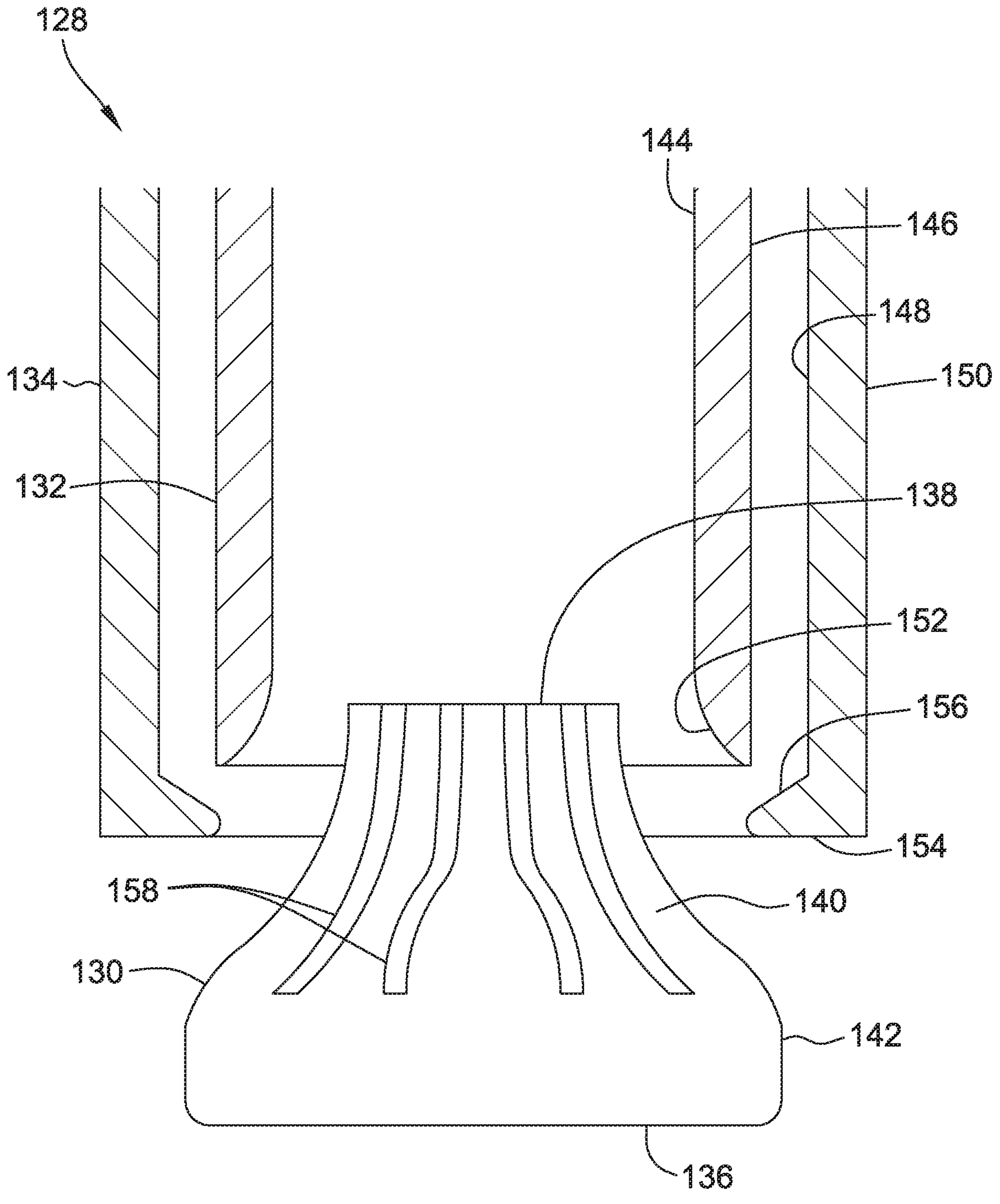
FIG. 3 is a schematic of a nozzle tip of a contaminated silicon extraction subassembly of the assembly shown in FIG. 1.

Referring now to FIG. 3, a tip of the nozzle 106 is shown schematically and is indicated generally at 128. The illustrated tip 128 includes a plunger 130 and a pair of concentric tubes situated adjacent the plunger 130, namely an inner tube 132 and an outer tube 134. The inside of the inner tube 132 is connected in flow communication with the vacuum source 108 across the holding reservoir 110, and the annulus between the outside of the inner tube 132 and the inside of the outer tube 134 is connected in flow communication with the carrier gas source 112. Optionally, the plunger 130 may be mounted to the inner tube 132, the outer tube 134, and/or any other suitable support structure that facilitates enabling the plunger 130 to be positioned and function as described herein.

The illustrated plunger 130 has a distal end 136, a proximal end 138, and a sidewall 140 that extends (e.g., tapers) from the distal end 136 toward the proximal end 138. In some embodiments, the distal end 136, the proximal end 138, and the sidewall 140 are generally annular (e.g., circular or elliptical) in cross-section. In other embodiments, however, the distal end 136, the proximal end 138, and/or the sidewall 140 may have any suitable cross-section (e.g., a square cross-section or a triangular cross-section).

In some embodiments, the sidewall 140 may have an exterior surface 142 with an irregular contour (e.g., the exterior surface 142 of the illustrated sidewall 140 comprises a plurality of circumferentially-spaced channels 158 that extend from near the proximal end 138 toward the distal end 136) to facilitate liquid transport from near the distal end 136 toward the proximal end 138 along the exterior surface 142. Other capillary-type structures, contour irregularities, or surface features suitable for wicking liquid from near the distal end 136 toward the proximal end 138 are also contemplated.

Moreover, the exterior surface 142 is made of a material that is wettable by molten silicon. As used herein, a material is "wettable" if a smaller contact angle (e.g., less than ninety degrees or, more preferably, less than forty-five degrees) is achievable between molten silicon and the material during a sessile drop test. With larger contact angles, droplets of molten silicon tend to be more spherical. However, with smaller contact angles, droplets of molten silicon tend to be flatter. As such, materials that yield smaller contact angles are preferred for use on the plunger 130.

Graphite and silicon carbide (SiC) are examples of "wettable" materials as used herein, while quartz (e.g., unmodified quartz) and silicon nitride (Si3N4) are examples of materials that are not "wettable" as used herein. Thus, in an embodiment, the exterior surface 142 may be made entirely of silicon carbide (SiC). In another embodiment, the exterior surface 142 may be made of silicon carbide coated graphite. In other embodiments, the exterior surface 142 may be made of unmodified graphite. Alternatively, the exterior surface 142 may be made of any suitable material that enables the plunger 130 to function as described herein.

Each of the illustrated tubes 132, 134 has a ring-shaped (e.g., circular or elliptical) cross-section. In this manner, the inner tube 132 has a radially inner surface 144 and a radially outer surface 146, and the outer tube 134 likewise has a radially inner surface 148 and a radially outer surface 150. Furthermore, the inner tube 132 has a distal end surface 152 that is oblique (i.e., is not perpendicular) to the inner surface 144 or the outer surface 146, such that the distal end surface 152 slopes radially outward from the inner surface 144 toward the outer surface 146. Additionally, the outer tube 134 has a distal end surface 154 that adjoins the inner surface 148 in a manner that defines an annular hook 156 which extends radially inward (e.g., radially inward beyond radially outer surface 146 of inner tube 132). Alternatively, in other embodiments, the inner tube 132 and the outer tube

134 may have any suitable configuration that enables the nozzle 106 to function as described herein.

Figure 4:
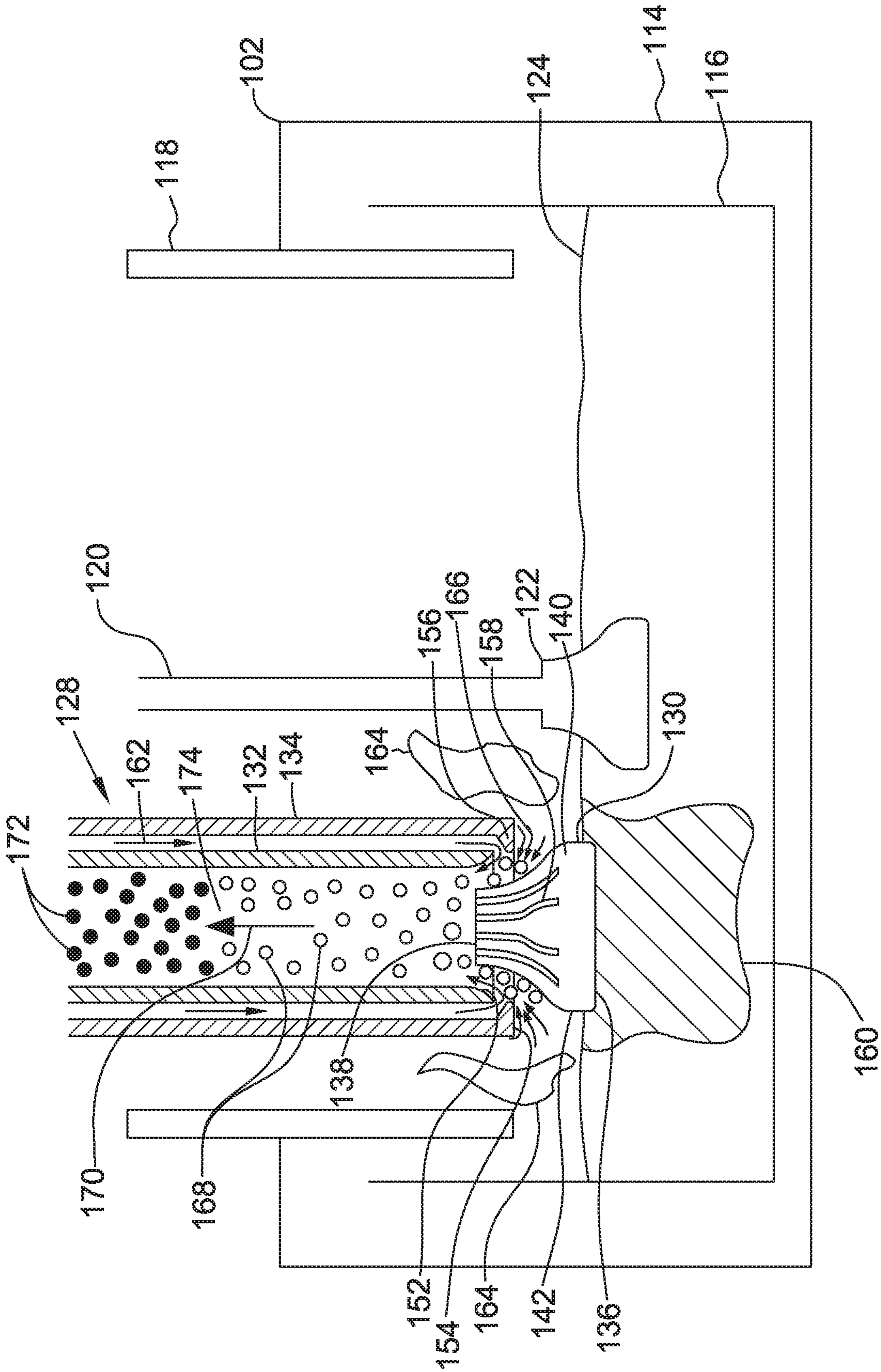
FIG. 4 is a schematic of the nozzle tip shown in FIG. 3 inserted into the subassembly shown in FIG. 2.

FIG. 4 illustrates an example of the extraction subassembly 104 during use. In the illustrated embodiment, with respect to the growth subassembly 102, a batch of polysilicon has been placed into the crucible 116 and melted by elevating the temperature inside the furnace 114, thereby making molten silicon 124. Furthermore, the seed crystal 122 has been loaded onto the puller mechanism 120 and dipped into the molten silicon 124 through the cooling structure 118. For purposes of this example, the illustrated seed crystal 122 is at least the second one to be dipped into this batch of molten silicon 124 (i.e., at least one monosilicon ingot had previously been grown from this batch of molten silicon 124) such that the level of contaminated silicon 160 is undesirably high and is in need of extraction to facilitate maintaining a higher degree of ingot quality.

To facilitate extracting contaminated silicon 160 from the crucible 116, the nozzle tip 128 can be inserted into the cooling structure 118 in an off-center manner and in an orientation that is substantially parallel to the puller mechanism 120 such that the nozzle tip 128 is adjacent the cooling structure 118 and the puller mechanism 120 (e.g., the nozzle tip 128 is in closer proximity to the cooling structure 118 than is the puller mechanism 120). In this manner, the plunger 130 is dipped into the contaminated silicon 160 such that the distal end 136 is submerged, while the proximal end 138 and at least part of the sidewall 140 remain unsubmerged. In this example, the contaminated silicon 160 is removed from the crucible 116 while a monosilicon ingot is grown in the crucible 116. However, the nozzle 106 is also useful in removing the contaminated silicon 160 between ingot growth events (i.e., while a monosilicon ingot is not being grown in the crucible 116).

With the plunger 130 partly submerged in the contaminated silicon 160, a thin layer of contaminated silicon 160 develops on the exterior surface 142 of the unsubmerged segment of the plunger 130 as a result of the exterior surface 142 being at least in part fabricated from a material that is wettable or including features that increase wetting (e.g., a capillary-type structure that wicks the contaminated silicon 160 toward the proximal end 138 from near the distal end 136 along the sidewall 140). The illustrated channels 158, or other suitable surface irregularities, facilitate this wetting action, as does the fact that silicon has a high surface tension, a low wetting angle on certain materials, and a low viscosity.

With the exterior surface 142 of the plunger 130 wetted in contaminated silicon 160, the carrier gas source 112 is actuated to inject a carrier gas 162 (e.g., argon and/or helium) into the environment 164 that surrounds the unsubmerged segment of the plunger 130. The vacuum source 108 is likewise actuated to initiate a flow of gas 170 (e.g., a mixture of carrier gas 162 and ambient gas 166 from the environment 164) to the vacuum source 108 across the holding reservoir 110. The hook 156 of the outer tube 134 and the oblique distal end surface 152 of the inner tube 132 cooperate to facilitate a smoother transition for the carrier gas 162 flowing into the inner tube 132 from the outer tube 134. Optionally, in another embodiment, the nozzle 106 does not have the outer tube 134 but, instead, the nozzle 106 includes only the inner tube 132 to initiate a flow of the ambient gas 166, and/or a flow of carrier gas 162 that is supplied in a manner other than the outer tube 134.

As a result of the gas 170 flowing into the inner tube 132, the thin layer of contaminated silicon 160 on the outer surface 142 experiences a pressure gradient that shears (or separates) liquid droplets 168 of the contaminated silicon 160 away from at least a portion of the outer surface 142. The droplets 168 become suspended in the flow of gas 170 through the inner tube 132 and, as a result, are transported toward the vacuum source 108 via the inner tube 132. The size of each droplet 168 is controllable by controlling the thickness of the layer of contaminated silicon 160 that develops on the exterior surface 142 of the plunger 130 and by controlling the velocity of the gas 170 flowing over the exterior surface 142. The contaminated silicon 160 is thereby removed from the crucible 116 in a gradual, controlled manner. Thus, there is no rapid drop in the level of molten silicon 124 within the crucible 116, which facilitates removing the contaminated silicon 160 during a crystal-growth process phase. However, in the event that excessive vibrations are generated when removing contaminated silicon 160 during a crystal-growth process phase, then it is preferable to instead remove the contaminated silicon 160 during a non-growth process phase (e.g., before stabilization).

When the nozzle 106 (e.g., the inner tube 132) is positioned in close proximity to the cooling structure 118, the cooling structure 118 has a cooling effect which facilitates radiative and convective heat loss and causes the droplets 168 to solidify into solid or semi-solid particles 172 during transport to the holding reservoir 110 in which the particles 172 are collected. The carrier gas 162 (e.g., the argon and/or the helium) also facilitates convective cooling of the droplets 168 and thereby increases the rate at which the droplets 168 solidify into particles 172. In this manner, a three-phase flow control technique is provided for vacuum-extracting a liquid (e.g., molten, contaminated silicon 160).

The particles 172 that collect in the holding reservoir 110 are flowable solids (in the aggregate) and, as a result, are easily removed from the holding reservoir 110 using, for example, a second vacuum source to draw the particles 172 out of the holding reservoir 110 through a filter for proper disposal or recycle. The holding reservoir 110 can alternatively be exchanged and cooled, and the particles 172 then poured from the holding reservoir 110 during process phases where melt extraction is not needed (e.g., during necking). In embodiments, contaminants within each droplet 168 can concentrate by segregation in the portion of the droplet 168 that is last to solidify. Since the portion that is last to solidify will often be near the surface of the droplet 168, an external film of contaminants can be present on the surface of each particle 172. This concentration of contaminants facilitates easier removal of the contaminants from the particles 172 (e.g., by etching the film off of the surface of each particle 172) when purifying the particles 172 for recycling purposes.

Optionally, more than one nozzle 106 may be synchronously or asynchronously inserted into the space surrounding the puller mechanism 120 to facilitate a more cooperative and/or expedient extraction of the contaminated silicon 160 from the crucible 116. Moreover, each nozzle 106 may be operated in a continuous manner (e.g., may remain inserted into the crucible 116 and the cooling structure 118 throughout the entire useful life of the crucible 116 and/or across multiple ingot growth events). Alternatively, each nozzle 106 may be operated in a cycled manner (e.g., may be periodically inserted into, and removed from, the crucible 116 and the cooling structure 118 at suitable intervals throughout the useful life of the crucible 116).

Because silicon expands when it solidifies, the extraction subassembly 104 described above facilitates solidification of the molten silicon 160 while it is suspended in the gas 170 to minimize damage (e.g., clogging or fracture) to the structural components (e.g., the nozzle 106 or the holding reservoir 110), which could otherwise result if molten silicon 160 was permitted to contact and solidify on structural components of the extraction subassembly 104.

Generally, larger droplets 168 are prevented from forming to facilitate ensuring that the droplets 168 solidify while suspended in the gas 170, and because larger droplets 168 may not have enough time to solidify before reaching the holding reservoir 110. In the illustrated extraction subassembly 104, the flow of gas 162 and/or 166 across the exterior surface 142 generates a thin film of contaminated silicon 160 at the top of the meniscus and results in smaller droplets 168 becoming suspended. The surface features of exterior surface 142 also facilitate mechanically thinning the silicon meniscus into smaller droplets 168.

To facilitate the solidification of the droplets 168 suspended in the gas 170, the droplets 168 are prevented from prematurely contacting the inner tube 132. For example, the inner tube 132 of the illustrated embodiment is shaped to have a generally linear (or non-tortuous) extension from the distal end surface 152 through at least a region 174 of the flow path at which sufficient solidification of the droplets 168 is expected. After the region 174 of expected solidification, the inner tube 132 may have any suitable shape (e.g., any suitable twists or turns). Notably, the portions of the inner tube 132 nearest the distal end surface 152 will be the hotter portions of the inner tube 132, while the portions of the inner tube 132 nearest the cooling structure 118 will be the cooler portions of the inner tube 132. In general, it is preferable to have a temperature gradient in the inner tube 132 of at least about 1° C./mm (e.g., between about 3° C./mm and about 10° C./mm) to facilitate a more rapid solidification process.

Figure 5:
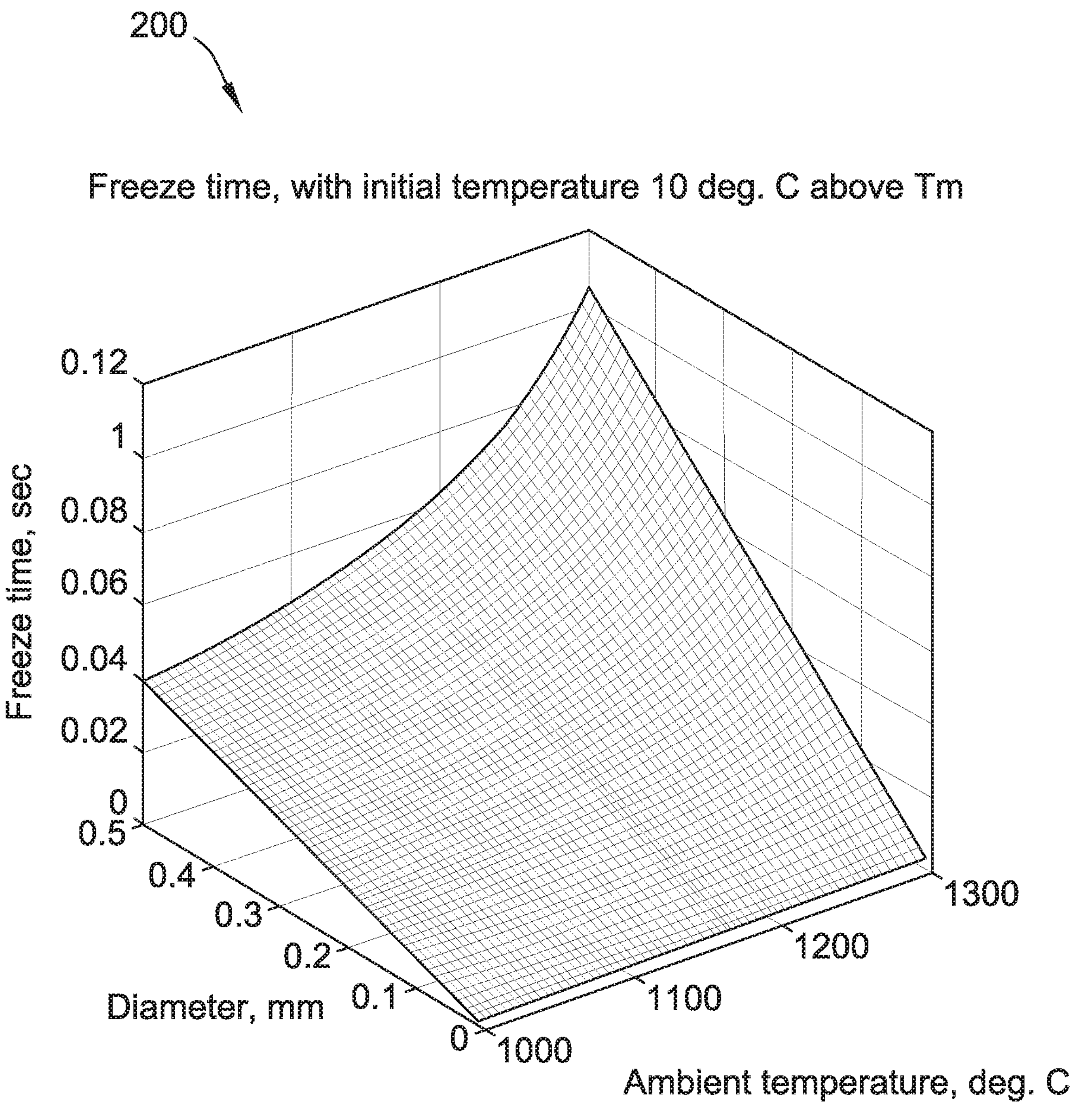
FIG. 5 is a graph of mathematical data that illustrates a size-dependent and temperature-dependent solidification characteristic of molten silicon droplets suspended in a flow of inert gas through a tube of the extraction subassembly shown in FIGS. 1 and 3.

FIG. 5 is a graph 200 of mathematical data which illustrates a size-dependent and temperature-dependent solidification (e.g., freezing) characteristic of the droplets 168 while suspended in the flow of gas 170 through the inner tube 132. More specifically, the data indicates the radiative cooling effect on a sphere of liquid silicon starting at 10° C. above the melting point to determine the necessary time for various silicon liquid spheres to cool to the silicon melting point. As shown, if the hemispherical temperature field radiated by a droplet 168 has a mean temperature of 1200° C., and if the diameter of the droplet 168 is 0.2 mm, then 19 milliseconds is required for the droplet 168 to reach the melting point and to start solidifying (e.g., freezing). If the droplet 168 had a velocity of 10 m/sec, then the droplet 168 would travel 1 cm in a millisecond, so 19 cm would be required for droplet 168 to start solidifying (e.g., freezing).

With the systems and methods described, a vacuum extraction technique is facilitated by the formation of small silicon droplets in a high-velocity vacuum flow of argon or other suitable gas such that the droplets solidify into solid particles for ex-situ filtering and disposal (or for secondary sales). The increase of contaminants in a Cz or CCz melt over time can eventually limit product quality causing premature run termination in advance of full quartz consumption, thereby increasing the cost of crystal growth above a minimum cost. Using the systems and methods described to extract residual growth melt, the contaminants can be extracted with the residual liquid silicon, reducing the contamination level so that further crystal growth of reduced contamination material may be performed. As an example, if the accumulation of carbon in a Cz process or metal in a CCz process was to exceed a threshold level after three monosilicon ingots, then a run would typically need to be terminated after two monosilicon ingots. However, if most of the residual growth melt could instead be extracted and then refilled with fresh silicon, then growing a few more ingots could be possible, thus distributing the crucible cost over more production and lowering the cost per kilogram of grown monosilicon.

The methods and systems set forth above are suitable for use in many fields other than that of monosilicon production. Rather, the methods and systems set forth above can be used to extract any suitable liquid in a manner that causes suspended droplets of the liquid to change phases into a solid during vacuum-driven transport to a holding reservoir.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions and methods without departing from the scope of the invention, it is intended that all matter contained in the above description and shown in the accompanying drawings shall be interpreted as illustrative and not in a limiting sense.

What is claimed is:

1. A system for extracting molten material comprising:

a vacuum source;

a nozzle having a wettable plunger submersible in a molten material and a vacuum tube connected in flow communication with the vacuum source such that, when the plunger is partly submerged in the molten material and the vacuum source is actuated to initiate a flow of gas through the vacuum tube, droplets of the molten material separate from at least a portion of the unsubmerged part of the plunger and become suspended in the gas flow;

a cooling structure positioned adjacent to the vacuum tube to facilitate solidifying the droplets suspended in the gas flowing through the vacuum tube; and a carrier gas source and a carrier gas tube connected in flow communication with the carrier gas source, wherein the carrier gas tube concentrically surrounds the vacuum tube, wherein the carrier gas tube and the vacuum tube each have a distal end surface configured to facilitate a smoother transition of carrier gas flow from the carrier gas tube into the vacuum tube.

2. The system of claim 1, further comprising a holding reservoir across which the vacuum tube is connected in flow communication with the vacuum source such that the solidified droplets are collectable in the holding reservoir.

3. The system of claim 1, wherein the plunger has an exterior surface comprising a plurality of circumferentially-spaced channels.

4. The system of claim 1, wherein the cooling structure is a liquid-cooled cooling structure.

5. The system of claim 4, wherein the cooling structure is a water-cooled jacket of a monosilicon production assembly.

6. The system of claim 5, wherein the monosilicon production assembly is configured to grow monosilicon ingots via a Czochralski (Cz) or Continuous Czochralski (CCz) method.

* * * * *